(12) United States Patent
Nagarajan et al.

(10) Patent No.: US 11,767,217 B2
(45) Date of Patent: Sep. 26, 2023

(54) MEMS DEVICES AND METHODS OF FORMING THEREOF

(71) Applicant: VANGUARD INTERNATIONAL SEMICONDUCTOR SINGAPORE PTE. LTD., Singapore (SG)

(72) Inventors: Ranganathan Nagarajan, Singapore (SG); Jia Jie Xia, Singapore (SG); Rakesh Kumar, Singapore (SG); Bevita Kallupalathinkal Chandran, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/581,972

(22) Filed: Jan. 23, 2022

(65) Prior Publication Data
US 2022/0144625 A1 May 12, 2022

Related U.S. Application Data

(62) Division of application No. 16/675,245, filed on Nov. 6, 2019, now Pat. No. 11,267,696.

(51) Int. Cl.
*B81B 3/00* (2006.01)
*B81C 1/00* (2006.01)

(52) U.S. Cl.
CPC .......... *B81B 3/0081* (2013.01); *B81C 1/0069* (2013.01); *B81B 2203/0127* (2013.01); *B81B 2203/0307* (2013.01); *B81C 2201/0105* (2013.01)

(58) Field of Classification Search
CPC ... B81B 3/001; B81B 3/0005; B81C 2201/11; B81C 1/00984; B81C 1/0096
See application file for complete search history.

(56) References Cited

U.S. PATENT DOCUMENTS

| | | |
|---|---|---|
| 2012/0025337 A1 | 2/2012 | Leclair |
| 2013/0161702 A1 | 6/2013 | Chen |
| 2014/0270271 A1 | 9/2014 | Dehe |
| 2016/0318753 A1* | 11/2016 | Chou ................ B81C 1/00952 |
| 2020/0079642 A1 | 3/2020 | Chou |
| 2020/0156110 A1* | 5/2020 | Miao .................... B06B 1/0292 |

* cited by examiner

*Primary Examiner* — John A Bodnar
(74) *Attorney, Agent, or Firm* — Winston Hsu

(57) ABSTRACT

A method of forming a MEMS device includes providing a substrate having a device stopper. The device stopper is integral to the substrate and formed of the substrate material. A thermal dielectric isolation layer may be arranged over the device stopper and the substrate. A device cavity may be formed in the substrate and the thermal dielectric isolation layer. The thermal dielectric isolation layer and the device stopper at least partially surround the device cavity. An active device layer may be formed over the thermal dielectric isolation layer and the device cavity.

9 Claims, 8 Drawing Sheets

– 1 –

MEMS DEVICES AND METHODS OF FORMING THEREOF

CROSS REFERENCE TO RELATED APPLICATIONS

This application is a division of U.S. application Ser. No. 16/675,245, filed on Nov. 6, 2019, the content of which is incorporated herein by reference in its entirety.

BACKGROUND OF THE INVENTION

1. Field of the Invention

The present disclosure relates generally to microelectromechanical system (MEMS) devices and methods of forming MEMS devices.

2. Description of the Prior Art

MEMS devices such as a MEMS microphone, may include a MEMS device layer such as one or more piezoelectric thin films to convert acoustic waves to electric signals. The MEMS device layer may be separated from the semiconductor substrate by an isolation layer. For example, the isolation layer may be a thermal silicon oxide layer. The thermal silicon oxide layer formed by conventional thermal oxidation process is able to achieve a thickness of up to about 2 um which is relatively thin. However, existing MEMS device having the relatively thin thermal silicon dioxide isolation between the semiconductor substrate and the MEMS device layer exhibits parasitic capacitive coupling loss. The parasitic capacitance results in loss of signal and thus a lower signal to noise ratio (SNR).

In some cases, a thicker oxide isolation layer may be provided by TEOS oxide deposition. However, using the deposited TEOS oxide between the semiconductor substrate and the MEMS device layer degrades the device performance due to shift in the piezoelectric AlN stress (e.g., poor uniformity in membrane deflection, in a MEMS microphone for example, due to poor AlN stress uniformity as a result of high surface roughness of the deposited TEOS isolation layer) and higher x-ray diffraction for the piezoelectric AlN. Further, using the deposited TEOS oxide leads to an undercut in an etching process using vapor hydrofluoric acid (VHF) and poor uniformity within wafer due to the deposited TEOS oxide having a much higher etch rate than thermal oxide in the VHF etch.

From the foregoing discussion, it is desirable to provide an improved MEMS device and which has an improved isolation structure between the semiconductor substrate and the MEMS device layer.

SUMMARY OF THE INVENTION

Embodiments generally relate to MEMS devices and methods for forming the MEMS devices. According to various non-limiting embodiments, a MEMS device may include a substrate having a device stopper. The device stopper may be integral to the substrate and formed of the substrate material. A thermal dielectric isolation layer may be arranged over the device stopper and the substrate. A device cavity may extend through the substrate and the thermal dielectric isolation layer. The thermal dielectric isolation layer and the device stopper at least partially surround the device cavity. An active device layer (or MEMS device layer) may be arranged over the thermal dielectric isolation layer and the device cavity.

According to another embodiment, a MEMS device may include a substrate having a device stopper, and a thermal dielectric isolation layer arranged over the substrate. The thermal dielectric isolation layer may include a block trench having sidewalls and a bottom. The block trench is arranged over the substrate, and defines a shoulder portion of the thermal dielectric isolation layer. The device stopper at least partially surrounds the block trench in the thermal dielectric isolation layer.

According to various non-limiting embodiments, a method of forming a MEMS device is provided. The method may include providing a substrate having a device stopper. The device stopper is integral to the substrate and formed of the substrate material. A thermal dielectric isolation layer may be arranged over the device stopper and the substrate. A device cavity may be formed in the substrate and the thermal dielectric isolation layer. The thermal dielectric isolation layer and the device stopper at least partially surround the device cavity. An active device layer may be formed over the thermal dielectric isolation layer and the device cavity.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1A:
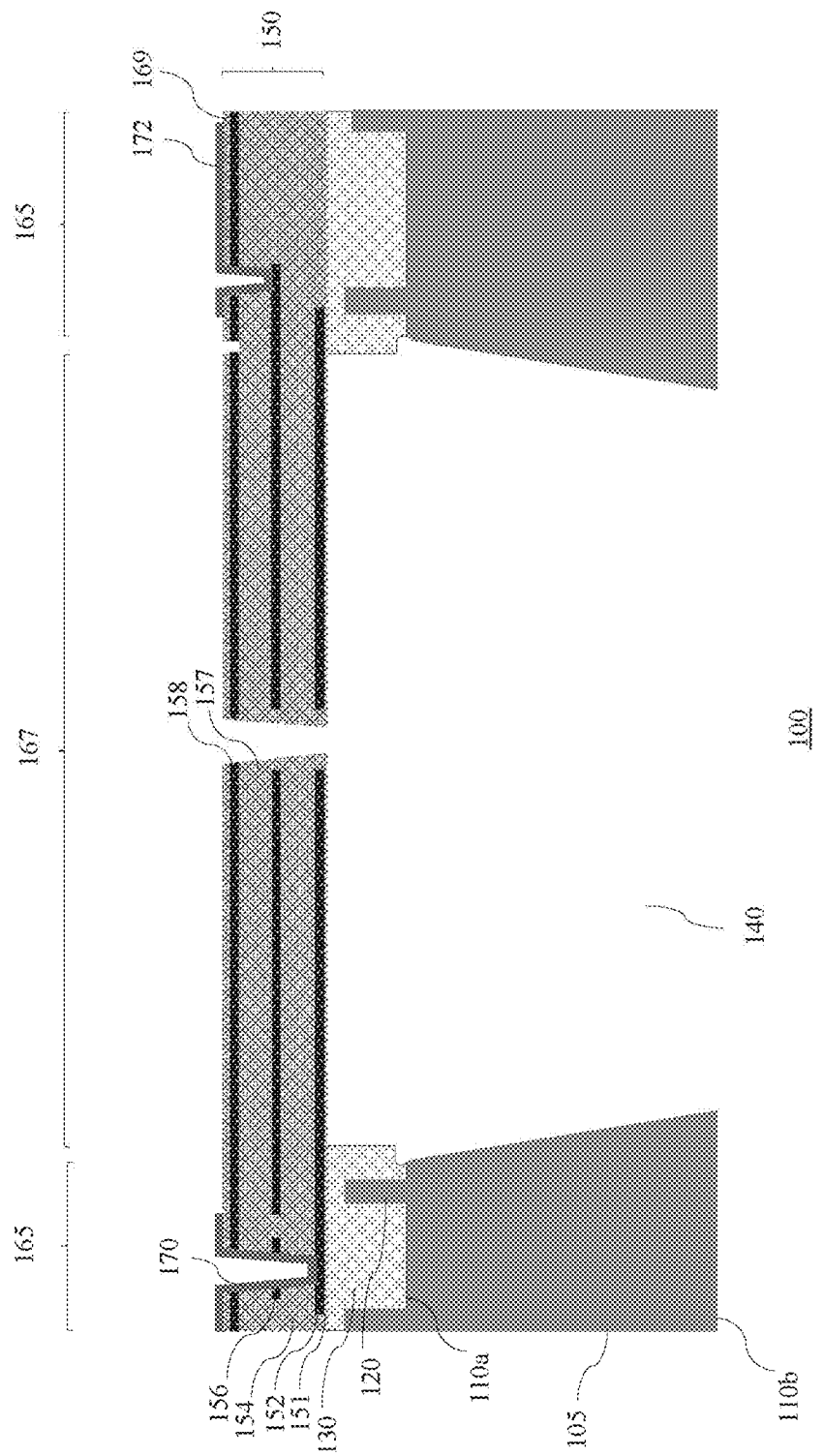
FIG. 1A shows a simplified cross-sectional view of an embodiment of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Embodiments of the present disclosure generally relate to microelectromechanical system (MEMS) devices. In various non-limiting embodiments, the MEMS device may include a MEMS device layer or active device layer arranged over a substrate and a device cavity extending through the substrate. According to various non-limiting embodiments, the substrate may include a device stopper. The device stopper may be integral to the substrate and formed of the substrate material. A thermal dielectric isolation layer may be arranged over the device stopper and the substrate. The thermal dielectric isolation layer may isolate the active device layer and the substrate. According to various non-limiting embodiments, the thermal dielectric isolation layer and the device stopper at least partially surround the device cavity. The thermal dielectric isolation layer may be a thick isolation layer formed by thermal oxidation of the substrate, as will be described in detail later. The thermal dielectric isolation layer and the device stopper according to various embodiments of the present invention advantageously reduce and/or restrict undercut of a portion of the thermal dielectric isolation layer below the active device layer which may otherwise result/occur due a release process in the MEMS device fabrication. Further, the thick thermal dielectric isolation may reduce parasitic capacitive coupling loss in the MEMS device caused by the semiconductor substrate.

The MEMS devices may be a microphone, pressure sensor, proximity/touch sensor, bulk acoustic wave (BAW) device, energy harvester, in various non-limiting examples.

FIG. 1A shows a simplified cross-sectional view of an embodiment of a device 100. In various non-limiting embodiments, the device 100 may be, or include, a MEMS device. The MEMS device may include a substrate 105. The substrate 105 may be a semiconductor substrate, such as a silicon substrate. Other types of semiconductor substrates, such as a silicon germanium substrate, may also be used. The substrate 105 may include a first substrate surface 110*a* and a second substrate surface 110*b*. The first substrate surface 110*a* and the second substrate surface 110*b* may be opposing surfaces of the substrate, as illustrated in FIG. 1A. For example, the first substrate surface 110*a* may be a top surface while the second substrate surface 110*b* may be a bottom surface of the substrate. Alternatively, the first substrate surface 110*a* may be a bottom surface while the second substrate surface 110*b* may be a top surface of the substrate.

According to various non-limiting embodiments, the substrate 105 may include a device stopper 120. The device stopper 120 may be integral to the substrate and formed of the substrate material. The substrate 105 and the device stopper 120 may be formed of semiconductor material such as silicon, in a non-limiting example. The device stopper 120 may have a pillar configuration arranged at a top side of the substrate. For example, the device stopper 120 extends from the first substrate surface 110*a*, as illustrated in FIG. 1A.

A thermal dielectric isolation layer 130 may be arranged over the device stopper 120 and the substrate 105. The thermal dielectric isolation layer may be a thermal oxide layer, such as a thermal silicon oxide layer, in a non-limiting example. The thermal dielectric isolation layer 130 may be formed by thermal oxidation of the substrate. According to various non-limiting embodiments, the thermal dielectric isolation layer 130 may be a thick dielectric layer having a thickness ranging from about 2 um to about 25 um, in a non-limiting example. The thickness of the thermal dielectric isolation layer 130 may be more than about 2 um, in a non-limiting embodiment. In various non-limiting embodiments, the thermal dielectric isolation layer 130 may be remaining sacrificial material of a sacrificial layer after a release process of an overlying active device layer 150 in the MEMS device fabrication. The thermal dielectric isolation layer 130 may be disposed between the active device layer 150 and the substrate 105. The thermal dielectric isolation layer 130 may exhibit low surface roughness as compared to a dielectric isolation layer formed by deposition (e.g., deposited TEOS oxide layer). The low surface roughness of the dielectric isolation layer 130 formed by thermal oxidation advantageously allows for improved uniformity in the active device layer 150 deposited on top of the isolation layer 130. This results in better device performance for example in the deflection of the active device layer 150 due to improved stress uniformity across the active device layer 150.

According to various non-limiting embodiments, the thermal dielectric isolation layer 130 covers a top surface of the device stopper 120. Said differently, the device stopper 120 extends at least partially through the thermal dielectric isolation layer 130, but does not extend completely through the entire depth or thickness of the thermal dielectric isolation layer 130. Accordingly, the device stopper 120 does not contact the overlying active device layer 150. In other embodiments, the device stopper 120 may completely extend through the depth of the thermal dielectric isolation layer 130 and contact the overlying active device layer 150.

A device cavity 140 may be arranged in the substrate 105. According to various non-limiting embodiments, the device cavity 140 may extend through the substrate 105 and the thermal dielectric isolation layer 130. Said differently, the substrate 105 and the thermal dielectric isolation layer 130 surround the device cavity 140. According to various non-limiting embodiments, the thermal dielectric isolation layer 130 and the device stopper 120 at least partially surround the device cavity 140.

The MEMS device may include an active device layer 150 arranged over the substrate 105 and the device cavity 140. The active device layer 150 may include an anchor region 165 and a free region 167. The active device layer 150 may be anchored or connected to the substrate 105 at the anchor region 165. A portion of the active device layer 150 may overlap the device cavity 140, and may be referred to as the free region 167 of the active device layer 150. In various non-limiting embodiments, the active device layer 150 may be used to generate electrical signals by piezoelectric effect. For example, the active device layer 150 may convert acoustic waves into electrical signals.

As illustrated in FIG. 1A, the active device layer 150 may be arranged over the thermal dielectric isolation layer 130 and the device cavity 140. The active device layer 150 may contact a top surface of the thermal dielectric isolation layer 130. The active device layer 150 may be anchored to the substrate 105 by the thermal dielectric isolation layer 130, in a non-limiting embodiment. The thermal dielectric isolation layer 130 may isolate the active device layer 150 and the substrate 105.

The active device layer 150 may include one or more piezoelectric layers. Each piezoelectric layer of the one or more piezoelectric layers may be disposed between two electrode layers. The active device layer 150, for example, may be a piezoelectric stack. In various non-limiting embodiments, the active device layer 150 may include a first electrode layer 152, a piezoelectric layer 154 over the first electrode layer 152, and a second electrode layer 156 over the piezoelectric layer 154. The first electrode layer 152, for example, may be a bottom electrode while the second electrode layer 156 may be a top electrode of the active device layer. In other embodiments, the active device layer 150 may include a further piezoelectric layer 157 over the second electrode layer 156, and a further electrode layer 158 over the further piezoelectric layer 157. For example, the first electrode layer 152 may be a bottom electrode, the second electrode layer 156 may be a middle electrode, and the further electrode layer 158 may be a top electrode of the active device layer 150. In yet other embodiments, the piezoelectric stack may include any number of piezoelectric layers and electrode layers. In various non-limiting embodiments, the active device layer 150 may further include a seed piezoelectric layer 151. The seed piezoelectric layer 151 may be disposed under the first electrode layer 152. The seed piezoelectric layer 151, for example, may facilitate the active device layer arranged over the seed piezoelectric layer 151 having a good crystal orientation.

In a non-limiting example, the one or more piezoelectric layers may be formed of a piezoelectric material, including but not limited to, aluminum nitride (AlN), scandium-doped AlN (ScAlN), piezoelectric ceramic lead zirconate and titanate (PZT), zinc oxide (ZnO), or combinations thereof. In a non-limiting example, the electrode layers may be formed of an electrically conductive material, including but not limited to, molybdenum (Mo), platinum (Pt), titanium (Ti), or combinations thereof.

According to various non-limiting embodiments, a passivation layer 169 may be arranged over the layers of the active device layer 150.

In various non-limiting embodiments, interconnects and bond pads may be arranged over the anchor region 165. For example, one or more via contacts 170 may be disposed through the active device layer 150 at the anchor region 165. The one or more via contacts 170 may provide electrical connection to the electrode layers in the active device layer 150. For example, the one or more via contacts 170 may electrically connect the first electrode layer and the second electrode layer 152 and 156. The one or more via contacts 170 may be electrically connected to one or more bond pads 172. The one or more bond pads 172 may be arranged over the active device layer 150 at the anchor region 165.

In a non-limiting example, the active device layer 150 may have a membrane structure. In a non-limiting embodiment, active device layer 150 may form a diaphragm of an acoustic sensor. For example, the MEMS device may be a MEMS microphone configured with the active membrane structure, in a non-limiting embodiment.

Figure 1B:
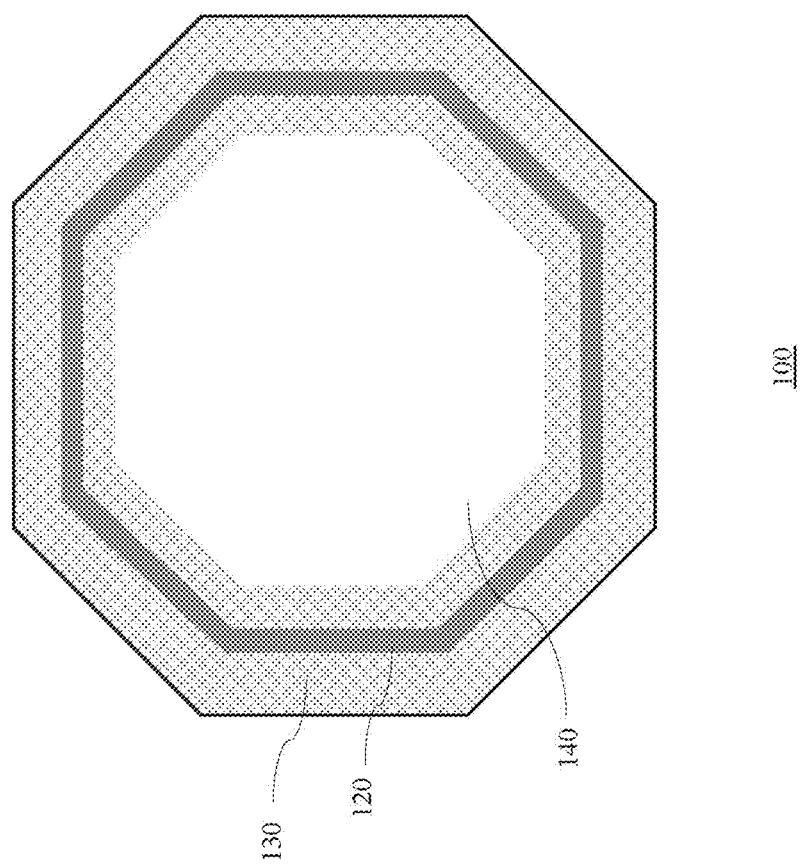
FIG. 1B shows a simplified top view of an embodiment of the device.

FIG. 1B shows a simplified top view of a cross section of an embodiment of the device 100. The device 100 may include a MEMS device, as described with respect to FIG. 1A. The MEMS device may include the device stopper 120 and the thermal dielectric isolation layer 130 arranged over the substrate (substrate not visible in FIG. 1B). The device stopper 120 and the thermal dielectric isolation layer 130 may at least partially surround the device cavity 140. In various non-limiting embodiments, the device stopper 120 may have a ring configuration at least partially surrounding the device cavity 140. In a non-limiting embodiment, the device stopper 120 has a ring configuration completely surrounding the device cavity 140, as illustrated in FIG. 1B. The device stopper 120, as illustrated, may have an octagonal ring shape. It should be understood that other types of ring shapes may also be applicable, such as heptagon ring, decagon ring, circular ring, zig zag ring, irregular ring, in various non-limiting examples. As described, the active device layer 150 may have a membrane structure and may be arranged over the thermal dielectric isolation layer 130 and the device cavity 140.

The MEMS device having the thermal dielectric isolation layer (or thermal oxide isolation structure) 130 according to various embodiments of the present invention may effectively reduce parasitic capacitive coupling loss in the MEMS device. Additionally, the device stopper 120 and/or the relatively thick thermal dielectric isolation layer 130 advantageously restricts an undercut of the thermal dielectric isolation layer during a release etch process for the active device layer, further reducing or preventing an overhang of the active device layer in the MEMS device. Further, according to various embodiments, the thick thermal dielectric isolation layer may be arranged without changing the surface roughness of the active device layer relative to a conventional thin thermal dielectric isolation layer.

FIGS. 2A-2F show simplified cross-sectional views of an embodiment of a process 200 for forming a device. The device formed, for example, is similar or the same as that shown and described in FIGS. 1A-1B. As such, common elements may not be described or described in detail.

In various non-limiting embodiments, a wafer or substrate 105 may be provided. The substrate may be a semiconductor substrate, such as a silicon substrate. Other types of semiconductor substrates, such as a silicon germanium substrate, may also be used. The substrate 105 may include a device stopper. The device stopper may facilitate forming an active device layer in the MEMS device fabrication. A thermal dielectric isolation layer may be arranged over the device stopper and the substrate.

Figure 2A:
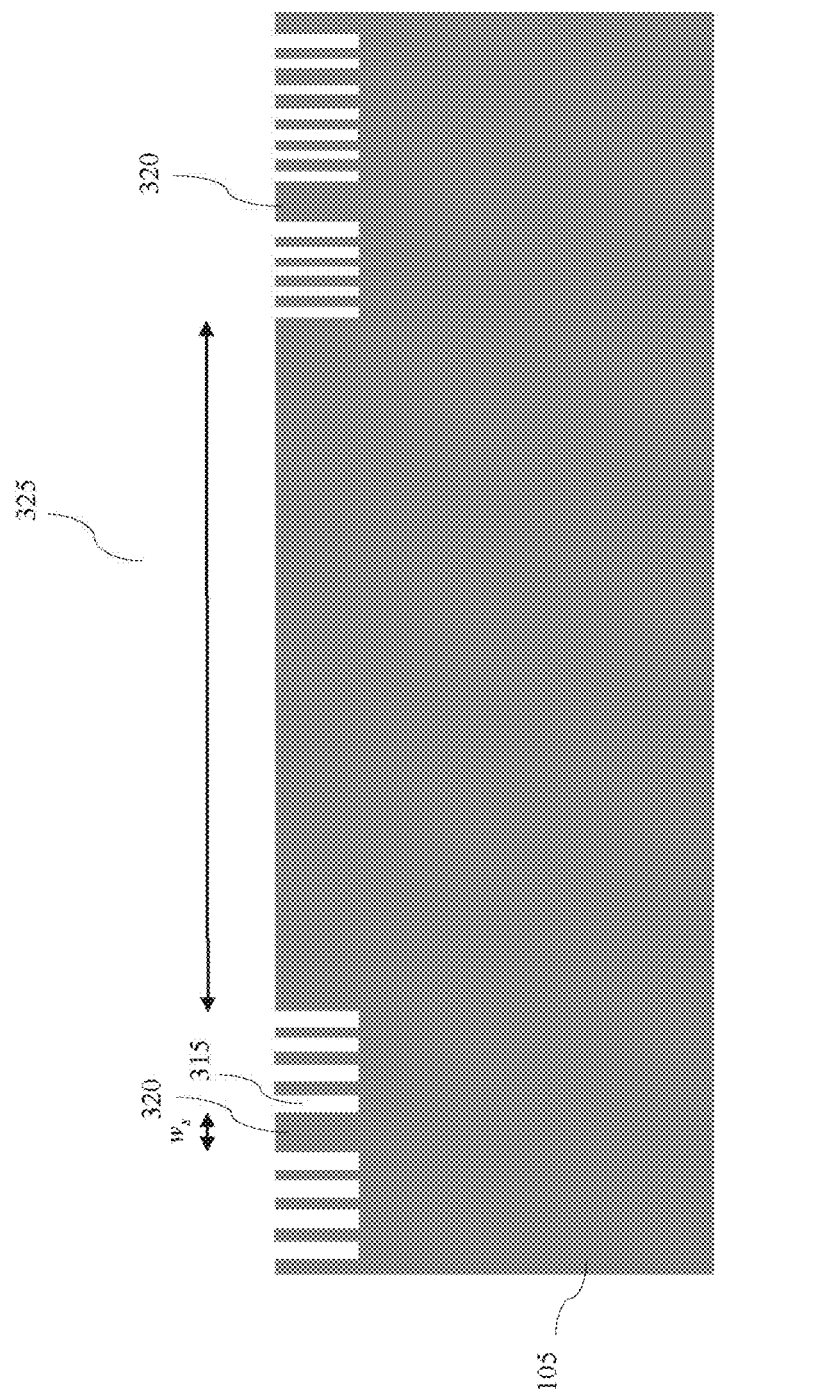
FIGS. 2A-2F show simplified cross-sectional views of an embodiment of a process for forming a device.

In various non-limiting embodiments, arranging the thermal dielectric isolation layer over the substrate includes forming a plurality of trenches 315 in the substrate 105, as illustrated in FIG. 2A. The plurality of trenches 315 may be spaced apart from one another and may have a depth depending on the desired thickness of the subsequently formed thermal dielectric isolation layer. In a non-limiting example, the trenches 315 may be arranged or formed with a depth ranging from about 5 um to about 25 um, and width ranging from about 0.1 to about 2 um. In a non-limiting example, trenches having a width of about 0.5 um may be formed in the substrate to subsequently form a thermal dielectric isolation layer having a thickness of about 1 um, while trenches having a width of about 0.2 um may be formed in the substrate to subsequently form a thermal dielectric isolation layer having a thickness of about 0.5 um. It is understood that other dimensions of the trenches 315 may also be used depending on the desired thickness of the thermal dielectric isolation layer. For example, the width and depth of the plurality of trenches 315 may be designed according to the desired thickness of the thermal dielectric isolation layer. The plurality of trenches 315 are arranged such that immediately neighboring trenches are spaced apart by narrow substrate material which may be consumed during thermal oxidation to produce a block of thermal dielectric isolation layer over the substrate 105. The plurality of trenches 315 may be formed by a mask and etch technique, in a non-limiting embodiment.

According to various non-limiting embodiments, the plurality of trenches 315 in the substrate 105 may be formed to further define the device stopper of the substrate. For example, two or more of the plurality of trenches 315 in the substrate may be formed to define an initial structure 320 of the device stopper, i.e., structure of the device stopper prior to performing thermal oxidation on the substrate. The initial structure of the device stopper may be formed with a predetermined dimension so that it is not completely consumed during thermal oxidation, and remaining substrate material from the initial structure of the device stopper may form a final structure of the device stopper. The device stopper may be integral to the substrate and formed of the substrate material. The initial structure 320 of the device stopper may have predetermined width $w_s$ ranging from about 5 um to about 10 um, in a non-limiting example. For example, the trenches 315 immediately adjacent or neighboring the initial structure 320 of the device stopper may be spaced apart by the predetermined width $w_s$. In various non-limiting embodiments, the trenches 315 in the substrate may be spaced apart to define an initial area 325 of the substrate for subsequently forming a block trench in the thermal dielectric isolation layer by the thermal oxidation.

Figure 2B:
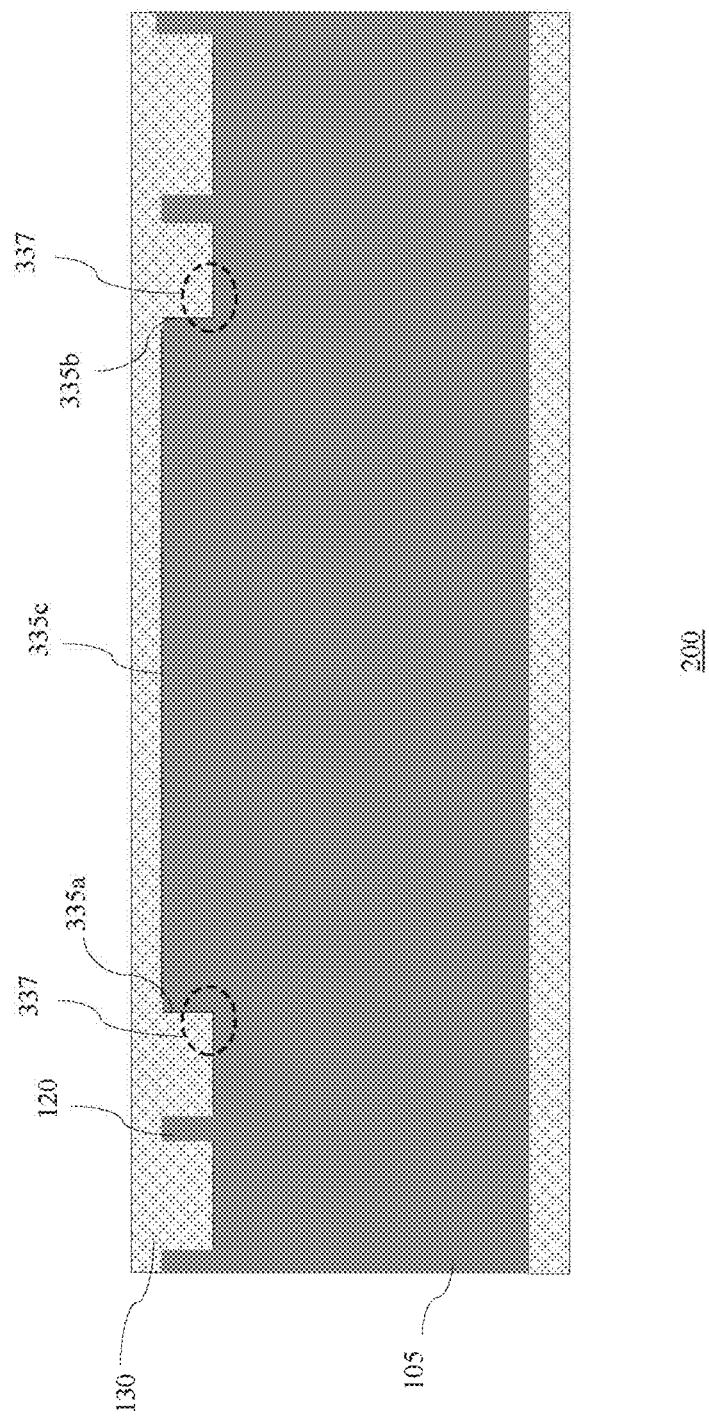

The thermal oxidation may be then performed on the substrate to form the thermal dielectric isolation layer. In a non-limiting example, an oxidation of the substrate 105 ranging from about 0.5 um to about 1 um may be performed to produce the thermal dielectric isolation layer. Further, various embodiments advantageously reduces thermal oxidation ranging from about 2 um to less than about 1 um. FIG. 2B illustrates an embodiment of the substrate 105 after performing thermal oxidation. Substrate material between the plurality of trenches 315 may be consumed to produce the thermal dielectric isolation layer 130 over the substrate 105. The thermal dielectric isolation layer 130 may be referred to as a localized oxide isolation structure or oxide block.

In various non-limiting embodiments, arranging the thermal dielectric isolation layer 130 over the substrate 105 includes forming the block trench 335 having sidewalls 335a and 335b and a bottom 335c in the thermal dielectric isolation layer such that the block trench 335 is arranged over the substrate 105. Said differently, the block trench 335 in the thermal dielectric isolation layer may be filled with substrate material. The sidewalls 335a and 335b of the block trench may define an active region of the subsequently formed active device layer.

According to various non-limiting embodiments, the block trench 335 defines a shoulder portion 337 of the thermal dielectric isolation layer. According to various non-limiting embodiments, the sidewalls 335a and 335b of the block trench in the thermal dielectric isolation layer is configured to serve as an alignment structure for forming the (subsequently formed) device cavity in the substrate and below the (subsequently formed) active device layer. A patterned mask layer for forming the device cavity (i.e., device cavity mask) may be aligned to the shoulder portion 337 as will be described later with respect to FIG. 2E. According to various non-limiting embodiments, the shoulder portion 337 of the thermal dielectric isolation layer is configured to restrict an undercut of the remaining thermal dielectric isolation layer (i.e., final structure) during a release etch process of the active device layer as the shoulder portion 337 itself is consumed/sacrificed during the release etch process.

The device stopper 120 at least partially surrounds the block trench 335 in the thermal dielectric isolation layer 130. For example, the thermal dielectric isolation layer 130 may be a localized trench oxide isolation structure having the device stopper 120 therein, according to various non-limiting embodiments.

In various non-limiting embodiments, the thermal dielectric isolation layer may be a thermal oxide layer, such as thermal silicon oxide layer in the case the substrate 105 is a silicon substrate, in a non-limiting example. The thermal dielectric isolation layer 130 may at least partly serve as a sacrificial layer in the fabrication of the MEMS device.

Figure 2C:
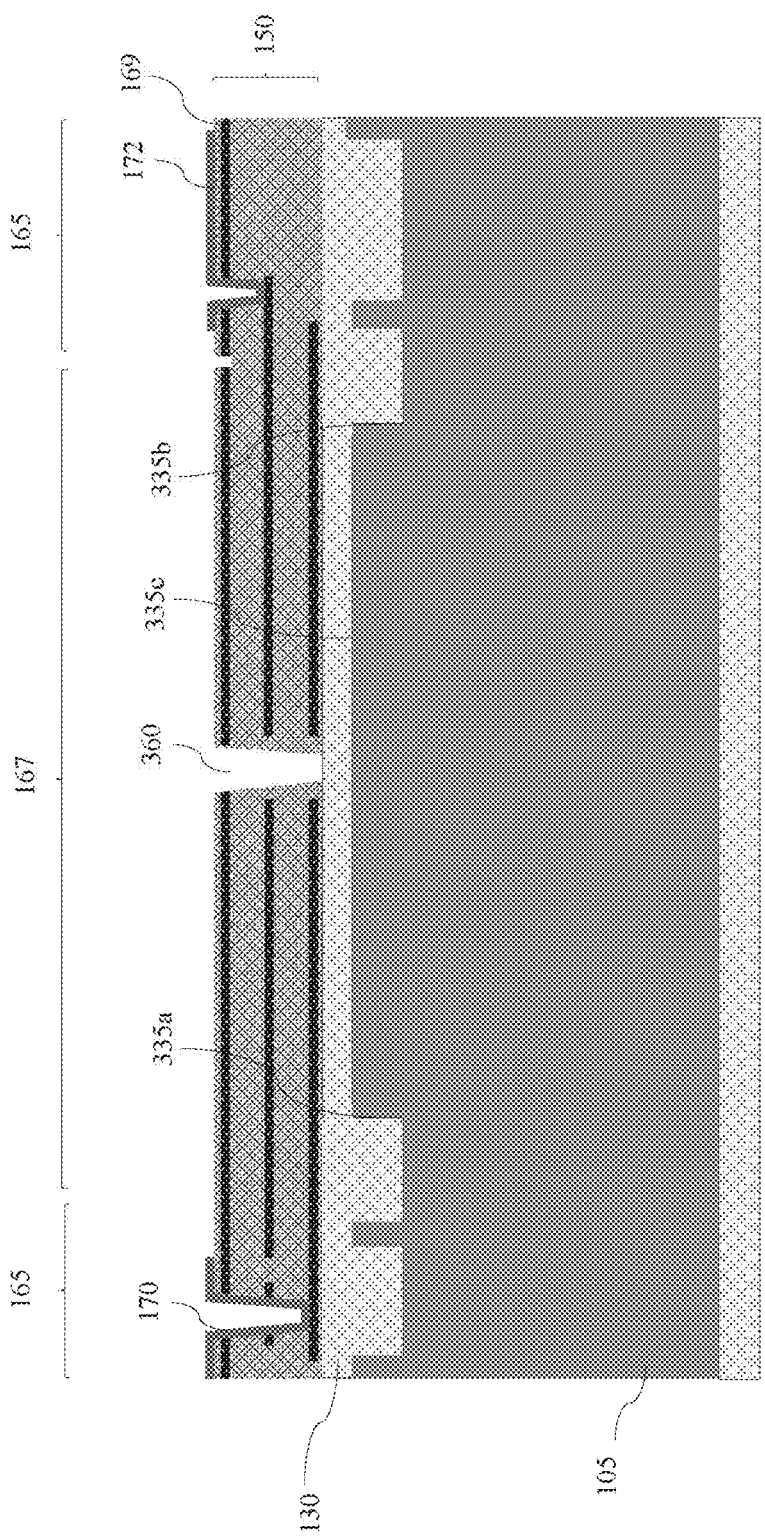

An active device layer 150 may be arranged or formed over the thermal dielectric isolation layer 130, as shown in FIG. 2C. The active device layer 150 may be aligned to the block trench 335 in the thermal dielectric isolation layer 130.

As illustrated, the active device layer 150 contacts a top surface of the thermal dielectric isolation layer 130. The active device layer 150 may be a piezoelectric stack having at least a first electrode layer, a piezoelectric layer over the first electrode layer, and a second electrode layer over the piezoelectric layer. In some embodiments, a seed piezoelectric layer may be deposited over the thermal dielectric isolation layer prior to deposition of the first electrode layer 122. In other embodiments, the seed piezoelectric layer may not be required for forming the piezoelectric stack. In various non-limiting embodiments, a further piezoelectric layer may be deposited over the second electrode layer, and a further electrode layer may be deposited over the further piezoelectric layer. The further piezoelectric layer and the further electrode layer may be optional depending on the design of the active device layer 150 and may not be required in some embodiments.

A passivation layer 169 may be deposited over the layers of the active device layer 150. The passivation layer 169 may be used to protect the electrode in the active device layer (e.g., top electrode) during and after the device release process. The passivation layer 169 may be, or include, AlN, silicon dioxide, silicon nitride, etc., in a non-limiting example.

The process 200 may continue to form device structures over the active device layer 150. According to various non-limiting embodiments, interconnects and bond pads may be arranged over the active device layer 150. For example, one or more via contacts 170 may be formed in the active device layer 150 at the anchor region 165 of the active device layer. Similarly, one or more bond pads 172 may be arranged over the active device layer 150 at the anchor region 165. For example, via openings may be formed in the piezoelectric stack by mask and etch techniques. The piezoelectric stack may be further patterned to form one or more openings for bond pads. A conductive layer may be deposited over the substrate 105 to form one or more bond pads and interconnects. The conductive layer may be Al, in a non-limiting example. The conductive layer may be patterned to form one or more via contacts 170 and one or more bond pads 172. In various non-limiting embodiments, one or more gaps 360 may be formed in the active device layer 150 as part of device structure. For example, the one or more gaps 360 may be formed simultaneously during patterning of the one or more via openings.

Figure 2D:
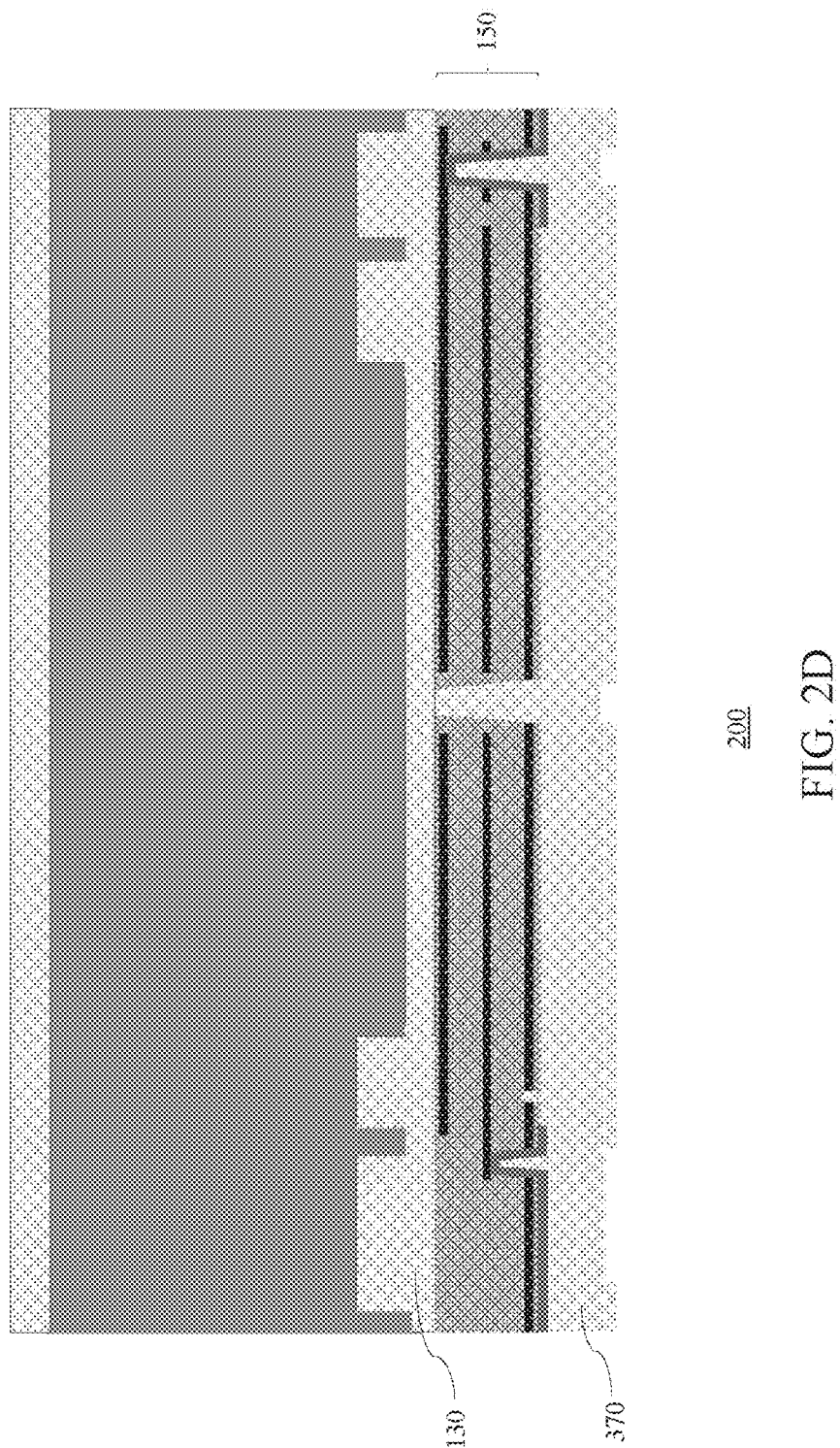

The process continues to form a device cavity of the MEMS device. The front side of the wafer or substrate 105 may be protected and the wafer may be flipped over to expose the backside of the wafer. In various non-limiting embodiments, a further sacrificial layer or protective layer 370 may be formed over the passivation layer and interconnects and/or bond pads to protect the passivation layer and interconnects and/or bond pads before the device release process, as shown in FIG. 2D. The protective layer 370 may be removed during the device release.

As illustrated in FIG. 2D, the protective layer 370 may be deposited over the active device layer 150 and substrate 105 to protect the active device layer 150 and for wafer bow control prior to forming the device cavity. In a non-limiting example, the protective layer 370 may be a thick oxide layer. The protective layer 370 may be a TEOS layer, in a non-limiting example. For example, the protective layer 370 may have a thickness ranging from about 500 nm to about 5000 nm. The substrate may be then flipped over for backgrinding a bottom surface of the substrate depending on the design of the MEMS device. For example, the substrate 105 may be backgrinded to a final thickness of about 200 um to about 600 um.

Figure 2E:
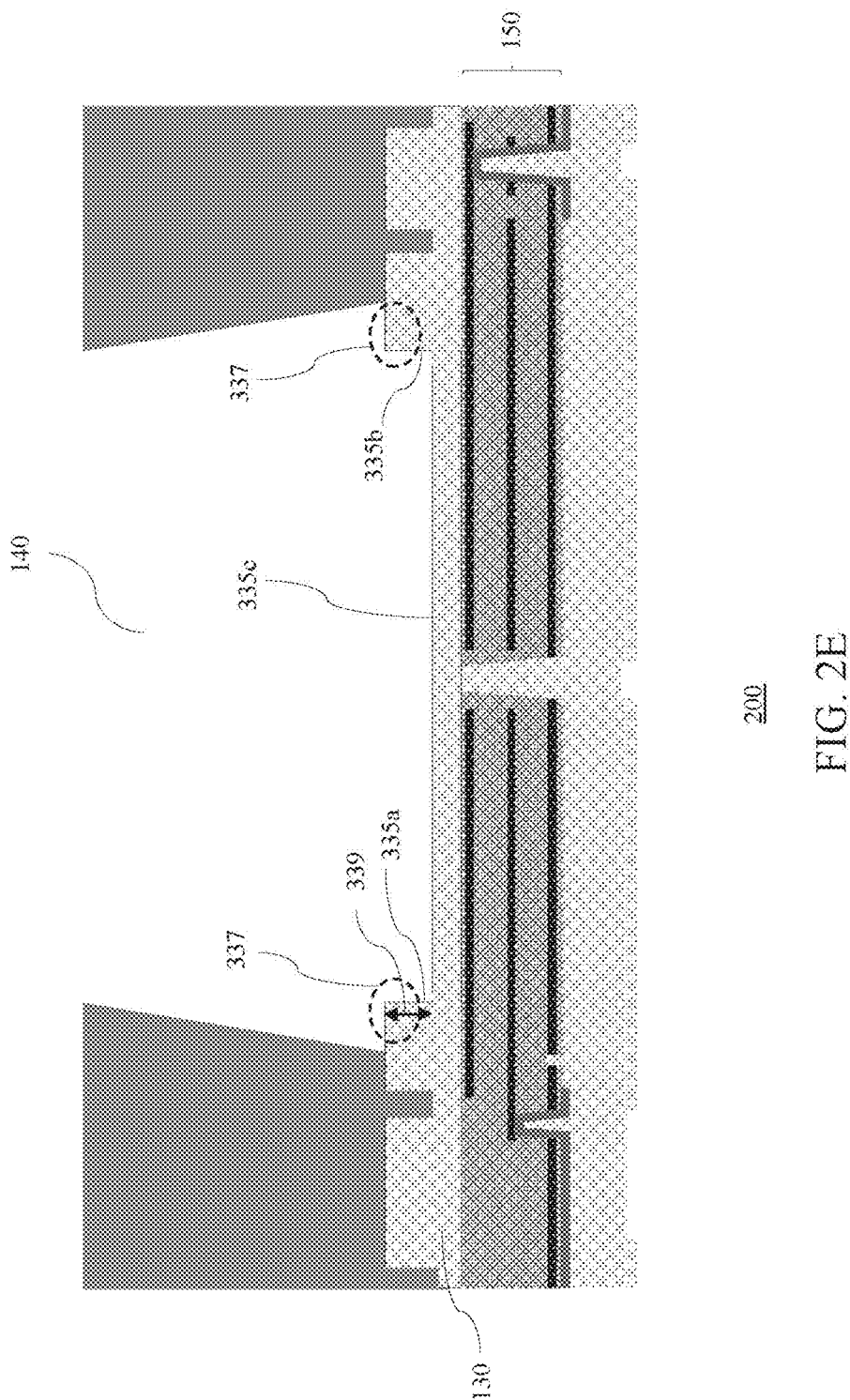

The substrate 105 may be patterned to form a device cavity 140, as illustrated in FIG. 2E. The device cavity 140 may be formed by patterning the bottom surface of the substrate using mask and etch techniques. For example, a patterned mask layer (or device cavity mask) as described may be used to expose an area of the substrate 105 corresponding to the cavity to be formed and the substrate may be etched by deep reactive-ion etching (DRIE) to form the device cavity 140. According to various non-limiting embodiments, the patterned mask layer (not shown) for forming the device cavity 140 may be aligned with the thermal dielectric isolation layer 130. For example, the patterned mask layer may be designed to be aligned to the shoulder portion 337 of the thermal dielectric isolation layer 130. By designing the device cavity mask which is wider than the surface of sidewalls 335a and 335b, the device cavity mask may be self-aligned to the thermal dielectric isolation layer 130 (or oxide block). For example, even if the device cavity mask is misaligned anywhere over the thermal dielectric isolation layer 130, the active region defined by surface of sidewalls 335a and 335b in the free region 167 is unaffected. Accordingly, the device cavity 140 formed may be aligned to the block trench 335 which defines the active region of the active device layer. Providing or forming the device cavity 140 which is aligned to the block trench 335 in the thermal dielectric isolation layer 130 (with the thermal dielectric isolation layer 130 being arranged on the frontside of the substrate or opposing side of the substrate to which the backside device cavity is formed) allows for more tolerance to any backside misalignment in the fabrication of the MEMS device. The aligned device cavity 140 may minimize misalignment of the subsequently released active device layer 150 (e.g., membrane structure of MEMS device).

The thermal dielectric isolation layer 130 may be used as etch stop layer for etching the device cavity 140. In a non-limiting example, the DRIE may be performed to form a cavity having a depth of about 400 nm, and stopping on the thermal dielectric isolation layer 130. For example, the etch lands on the outside of the shoulder portion 337 of the thermal dielectric isolation layer 130. In a non-limiting example, the shoulder portion 337 may have a depth $d_s$ 339 of about 2 um. As described, the trench 335 in the thermal dielectric isolation layer 130, for example, may define the active region or actual device area or structure of the MEMS device.

A release etch process may be performed to release the active device layer 150 of the MEMS device. The release etch process, for example, may target to remove a portion of the thermal dielectric isolation layer 130 below the active device layer 150 in the free region 167. For example, the release etch process may target to remove a portion of the thermal dielectric isolation layer 130 as defined by the block trench 335 having a thickness ranging from about 0.5 um to about 2 um.

Figure 2F:
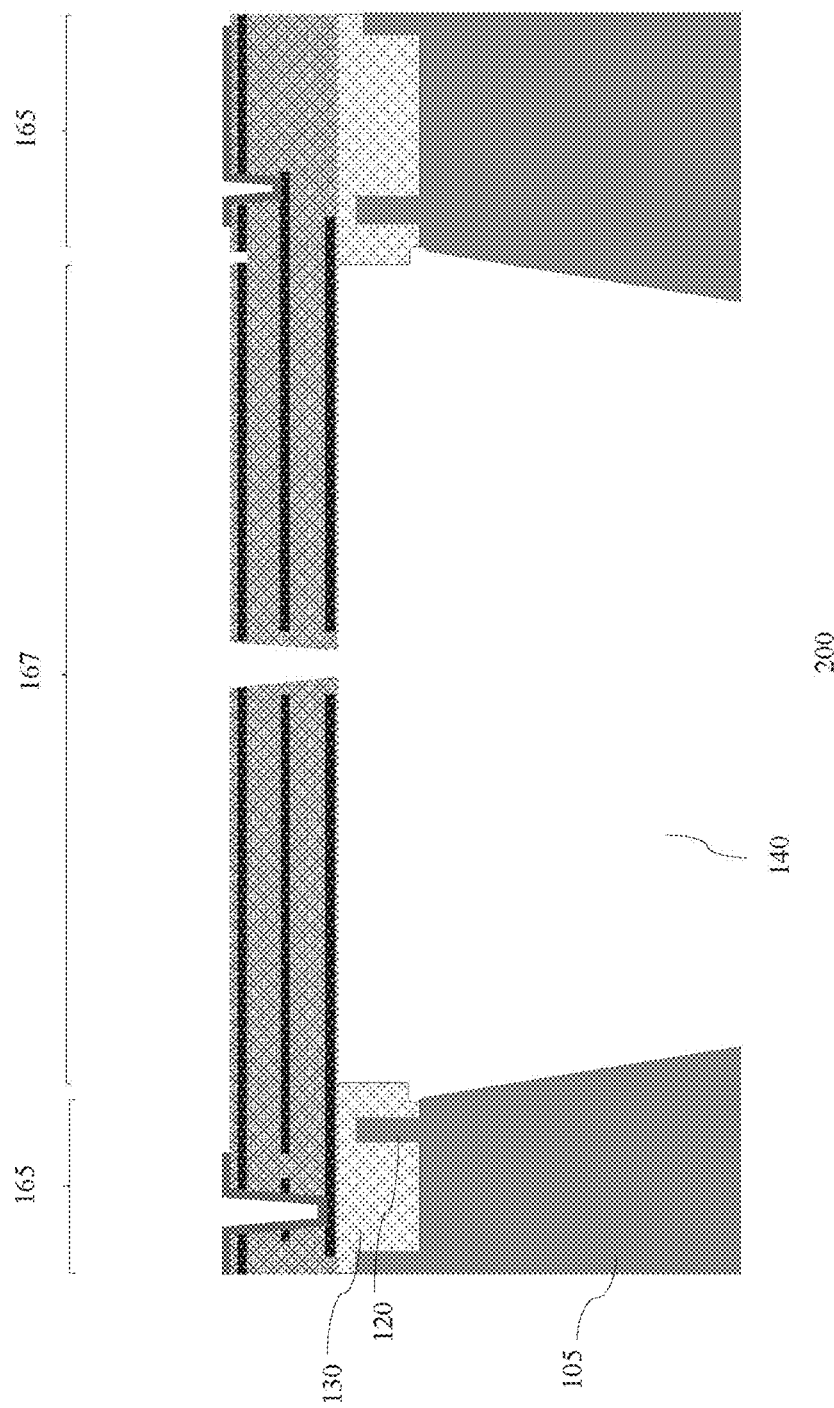

The release etch process may be a vapor release etch (e.g., using HF etching) to remove a portion of the thermal dielectric isolation layer 130 exposed by the device cavity 140, releasing the active device layer 150 over the substrate, as illustrated in FIG. 2F. The shoulder portion 337 of the thermal dielectric isolation layer 130 reduces or obviates an undercut of a portion of the thermal dielectric isolation layer 130 below the active device layer 165 at the anchor region 165 since the shoulder portion 337 itself is consumed/sacrificed during the release etch process. Accordingly, the shoulder portion 337 of the thermal dielectric isolation layer 130 may restrict an undercut of the thermal dielectric isolation layer 130 during the release etch process of the active device layer 150. Additionally, the thermal dielectric isolation layer 130 (e.g., thermal oxide) has a lower etch rate compared to deposited oxide layer (e.g., TEOS), therefore reduces undercut due to the vapor HF etch, and advantageously improves uniformity within the wafer.

Further, the device stopper 120 prevents or stops lateral etch and provides more protection from undercut during the release etch. The device stopper 120 inside the thermal dielectric isolation layer 130 allows more margin for the release etch process (e.g., using the vapor HF etch). The device stopper 120 may also prevent the vapor HF etch from propagating due to voids which may be present in the thermal dielectric isolation layer 130. According to various embodiments, the thermal dielectric isolation layer 130 (e.g., thermal oxide layer) as described above results in a residue-free vapor HF (VHF) release etch process.

The active device layer 150 may be anchored to the substrate by the residual or remaining thermal dielectric isolation layer 130 in the anchor region 165 after the release process. The thermal dielectric isolation layer and the device stopper at least partially surround the device cavity 140.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a MEMS device, comprising:
providing a substrate comprising a device stopper, wherein the device stopper is integral to the substrate and formed of the substrate material; and
arranging a dielectric isolation layer over the device stopper and the substrate, wherein the dielectric isolation layer is formed by thermal oxidation, and a top surface of the substrate and a top surface of the device stopper both are in contact with the dielectric isolation layer and on the same plane;
forming a device cavity in the substrate and the dielectric isolation layer; wherein the dielectric isolation layer and the device stopper are adjacent to the device cavity; and
forming an active device layer over the dielectric isolation layer and the device cavity.

2. The method of claim 1, wherein arranging the dielectric isolation layer over the substrate comprises forming a plurality of trenches in the substrate.

3. The method of claim 1, wherein arranging the dielectric isolation layer over the substrate comprises:
forming a block shaped trench having sidewalls and a bottom in the dielectric isolation layer such that the block shaped trench is arranged over the substrate; wherein the block shaped trench defines a shoulder portion of the dielectric isolation layer; and wherein the device stopper at least partially surrounds the block shaped trench in the dielectric isolation layer.

4. The method of claim 1, wherein the active device layer contacts a top surface of the dielectric isolation layer; and wherein the active layer is anchored to the substrate by the dielectric isolation layer.

5. The method of claim 1, wherein the active device layer comprises a piezoelectric stack having at least a first electrode layer, a piezoelectric layer over the first electrode layer, and a second electrode layer over the piezoelectric layer.

6. The method of claim 1, wherein the device stopper is formed of silicon material.

7. The method of claim 1, wherein the device stopper has a pillar configuration arranged at a top side of the substrate when perceived from a cross-sectional perspective.

8. The method of claim 1, wherein the device stopper has a ring configuration at least partially surrounding the device cavity when perceived from a top-down perspective.

9. The method of claim 1, wherein the active device layer is connected to the substrate at an anchor region of the active device layer, and further comprising arranging a bond pad over the active device layer at the anchor region.

* * * * *